United States Patent [19]
Norton

[11] Patent Number: 5,380,669
[45] Date of Patent: Jan. 10, 1995

[54] METHOD OF FABRICATING A TWO-COLOR DETECTOR USING LPE CRYSTAL GROWTH

[75] Inventor: Paul R. Norton, Santa Barbara, Calif.

[73] Assignee: Santa Barbara Research Center, Goleta, Calif.

[21] Appl. No.: 14,939

[22] Filed: Feb. 8, 1993

[51] Int. Cl.⁶ .......................................... H01L 31/18
[52] U.S. Cl. ................................ 437/5; 437/2;
437/3; 437/126; 437/130; 437/965; 437/974;
250/338.1; 250/339.01; 250/345; 250/372;
257/440; 257/442
[58] Field of Search ................ 437/2, 3, 5, 130, 126, 437/965, 974; 148/DIG. 101, DIG. 64, DIG. 120; 250/336.1, 338.1, 338.4, 339, 345, 370.12, 370.13, 370.14, 372; 257/21, 440–442, 451, 461

[56] References Cited

U.S. PATENT DOCUMENTS

| | | | |
|---|---|---|---|
| 4,589,192 | 5/1986 | Dinam et al. | 437/5 |
| 4,738,935 | 4/1988 | Shimbo et al. | 437/31 |
| 4,753,684 | 6/1988 | Ondris et al. | 136/258 |
| 4,847,489 | 7/1989 | Deitrich | 250/226 |
| 4,885,619 | 12/1989 | Kosai | 357/24 |
| 5,013,681 | 5/1991 | Godbey et al. | 437/974 |
| 5,113,076 | 5/1992 | Schelte | 250/370.06 |
| 5,149,956 | 9/1992 | Norton | 250/211 |
| 5,192,695 | 3/1993 | Wang et al. | 437/3 |
| 5,221,364 | 6/1993 | Hotaling | 437/4 |

FOREIGN PATENT DOCUMENTS

| | | | |
|---|---|---|---|
| 55-101832 | 8/1980 | Japan | 250/370.06 |
| 0102783 | 5/1986 | Japan | 437/5 |
| 2241605 | 9/1991 | United Kingdom | 437/5 |

OTHER PUBLICATIONS

J. M. Pawlikowski and P. Becla, "Some Properties of Photovoltaic $Cd_xHg_{1-x}Te$ Detectors for Infrared Radiation", Infrared Physics, vol. 15, (1975) pp. 331–337.
Rolls in "Two color sandwitch detector using $Insb/Pb_{0.79}Sn_{0.21}Te$" Infrared Physics 17(5), Sep. 1977, pp. 419–421.

Primary Examiner—Nam Nguyen
Assistant Examiner—Ramamohan R. Paladugu
Attorney, Agent, or Firm—W. C. Schubert; W. K. Denson-Low

[57] ABSTRACT

Disclosed is a method of fabricating a two-color radiation detector, and two-color photodetectors fabricated by the method. A structure is grown upon a substrate (10) to provide, in sequence, a LPE grown LWIR n-type layer (12), a MWIR p+ type common contact layer (14), and a MWIR n-type layer (16). Following growth of the MWIR n-type layer, a layer of passivation (18) is applied, and the substrate is removed to so as to enable further processing of the structure into an array (1) of two-color photodetectors. The three layer structure is bonded, prior to further processing, to a supporting substrate (22) with an adhesive bond made to the passivation layer. The supporting substrate is comprised of IR transparent material such as Group IIB-VIA semiconductor material, Group IIIA-VA semiconductor material, Group IVA semiconductor material, sapphire, and combinations thereof. The supporting substrate may be subsequently removed after hybridizing a photodetector array (2) with readout electronics to provide a thinned detector array having a reduced cool-down time.

11 Claims, 4 Drawing Sheets

METHOD OF FABRICATING A TWO-COLOR DETECTOR USING LPE CRYSTAL GROWTH

FIELD OF THE INVENTION

This invention relates generally to methods for fabricating semiconductor radiation detectors and, in particular, to a method for fabricating a semiconductor radiation detector that is simultaneously responsive to radiation within two spectral bands, or "colors".

BACKGROUND OF THE INVENTION

A desirable type of photodetector is a two-color infrared radiation (IR) detector having simultaneous sensitivity in two spectral bands. The spectral bands may include short wavelength IR (SWIR), medium wavelength IR (MWIR), long wavelength IR (LWIR), and very long wavelength IR (VLWIR). An array of two-color IR detectors may be employed in a number of imaging applications wherein it is required to simultaneously detect radiation within two spectral bands from a scene within a field of view of the array. By example, the array may simultaneously detect LWIR and MWIR, or LWIR and SWIR.

It is desirable to employ Liquid Phase Epitaxy (LPE) as a semiconductor layer epitaxial growth technique in that LPE provides high quality pn-junctions. However, it is difficult to grow, by LPE, a LWIR layer over an existing MWIR layer, in that the LPE melt for the LWIR material tends to dissolve the narrower bandgap MWIR layer. As a result, Molecular Beam Epitaxy (MBE) or Metal Organic Chemical Vapor Deposition (MOCVD) is typically employed to fabricate a LWIR layer upon a MWIR layer. However, the resulting pn-junction quality of the MBE or MOCVD grown LWIR/MWIR interface is, at present, inferior to that which would be obtained if LPE were used to form the LWIR/MWIR interface.

In U.S. Pat. No. 4,847,489, Jul. 11, 1989, entitled "Light Sensitive Superlattice Detector Arrangement with Spectral Sensitivity" Dietrich discloses a detector arrangement comprising a plurality of photosensitive detector elements. Each of the detector elements has a multilayer structure of alternating positively and negatively doped photosensitive semiconductor material having a superlattice structure. A control voltage is said to control spectral light sensitivity, and an optical filter arrangement is provided for dividing the photodetectors into an upper and lower effective spectral range group.

In U.S. Pat. No. 4,753,684, Jun. 28, 1988, "Photovoltaic Heterojunction Structures" Ondris et al. describe a three layer, double heterojunction Group II-VI photovoltaic structure.

In Japanese Patent No. 55-101832, Aug. 4, 1980, Makoto Itou discloses, in the Abstract, an infrared detector comprised of n-type HgCdTe having electrodes 2 and 3 arranged on opposite surfaces. A polarity of a bias voltage is switchably coupled to the electrodes 2 and 3. This device is said to enable rays of wide wavelength ranges to be detected by only one semiconductor detector.

General information regarding this subject matter is found in an article entitled "HgCdTe and Related Alloys" D. Long and J. L. Schmit, Semiconductors and Semimetals, Vol. 5, IR Detectors, Academic Press 1970.

An article entitled "Some Properties of Photovoltaic $Cd_xHg_{1-x}Te$ Detectors for Infrared Radiation", by J. M. Pawlikowski and P. Becla, Infrared Physics, Vol. 15 (1975) pp. 331-337 describes photovoltaic p-n junction detectors constructed of HgCdTe crystals and epitaxial films. The authors report that the position of a photosensitivity maximum is shifted within a spectral region of 1-9 microns by changing a molar fraction of cadmium.

It is an object of this invention to provide a method of fabricating a two-color infrared radiation detector by an LPE process, the detector including an LPE grown LWIR layer formed adjacent to a MWIR or a SWIR layer.

It is a further object of the invention to provide an array comprised of a plurality of three-layer n-p-n or p-n-p photodetector structures wherein at least a LWIR responsive layer is formed by LPE, and in which a middle, electrically common layer is electrically and physically continuous across the array.

SUMMARY OF THE INVENTION

The foregoing and other problems are overcome and the objects of the invention are realized by a method of fabricating a two-color radiation detector, and by two-color photodetectors fabricated by the method. A structure is grown upon a substrate to provide, in sequence, a LPE grown LWIR n-type layer, a MWIR p+ type layer, and a MWIR n-type layer. The substrate is comprised of a material selected from the group consisting essentially of Group IIB-VIA semiconductor material, Group IIIA-VA semiconductor material, Group IVA semiconductor material, and combinations thereof. Following growth of the MWIR n-type layer, a layer of passivation is applied, and the substrate is removed to so as to enable further processing of the structure into individual photodetectors. The three layer structure is bonded, prior to further processing, to a supporting substrate with, preferably, an adhesive bond made to the passivation layer. The supporting substrate is comprised of material selected from the group consisting essentially of Group IIB-VIA semiconductor material, Group IIIA-VA semiconductor material, Group IVA semiconductor material, sapphire ($Al_2O_3$), and combinations thereof. The supporting substrate may be subsequently removed after hybridizing the array with readout electronics to provide a thinned detector array having a reduced cool-down time to operating temperatures.

In accordance with an aspect of the invention, a LWIR/MWIR interface is formed over a substrate by first growing a wide bandgap LWIR layer by LPE, then growing subsequent narrower bandgap layers over the LWIR layer, inverting the structure, and removing the substrate. As a result, the LPE-grown LWIR layer overlies a narrower bandgap layer, which is the desired result.

An object of the invention is thus realized by a method of fabricating one or more two-color infrared detectors by a Liquid Phase Epitaxy process, each detector having simultaneous sensitivity in two spectral bands. Another object of the invention is realized by an array of two-color photodetectors constructed in accordance with the method.

A two-color detector array fabricated in accordance with the invention includes a three-layer epitaxial structure comprised of n-p-n or p-n-p back-to-back photodiodes. The photodiodes are comprised of an alloy semiconductor, such as HgCdTe, in which the alloy composition of the first and third layers defines the spectral sensitivity for absorbing first and second spectral bands, respectively.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

As employed herein SWIR radiation is considered to include a spectral region extending from approximately 1000 nm to approximately 4000 nm. MWIR radiation is considered to include a spectral region extending from approximately 3000 nm to approximately 8000 nm and LWIR radiation is considered to include a spectral region extending from approximately 7000 nm to approximately 14000 nm. Very Long Wavelength IR (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

Figure 1A:
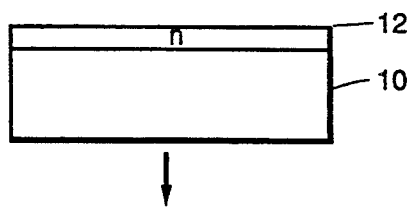
FIGS. 1a–1g are each a cross-sectional view, not to scale, showing the fabrication of a two-color IR detector in accordance with the invention.
Figure 1B:
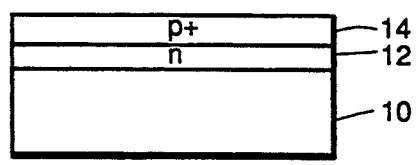
Figure 1C:
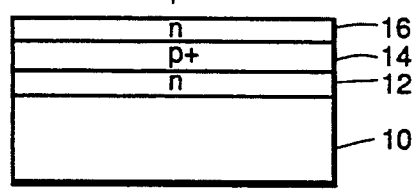
Figure 1D:
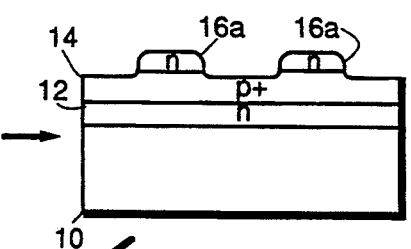
Figure 1E:
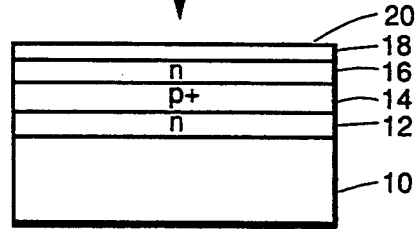
Figure 1F:
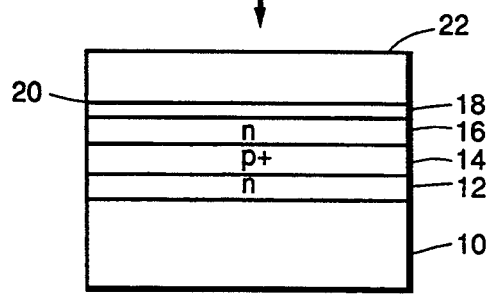
Figure 1G:
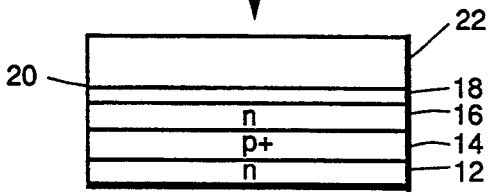
Figure 2:
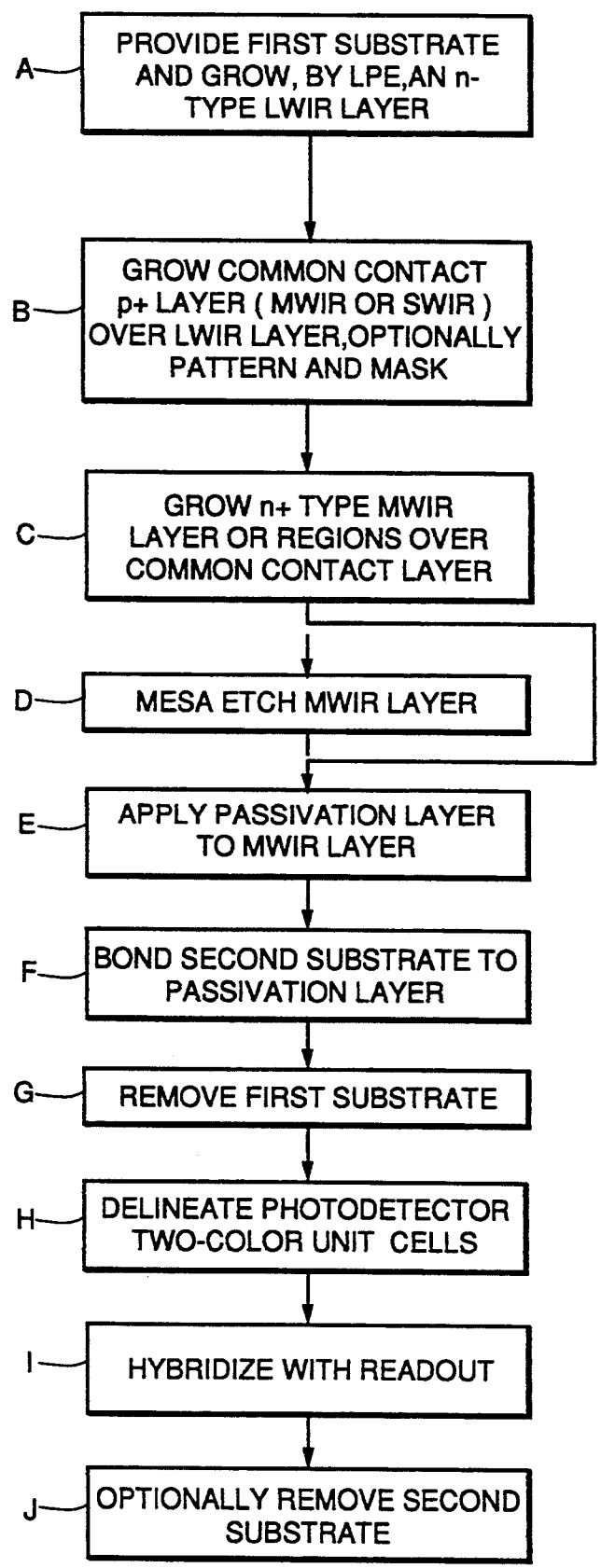
FIG. 2 is a process flow diagram that illustrates the method of the invention.

Reference is now made to FIGS. 1a–1g and to FIG. 2.

(FIG. 1a–FIG. 2, Block A) Processing begins with a substrate 10 suitable for growing a high quality layer of Group IIB-VIA semiconductor material thereon. One suitable substrate 10 material is the Group IIB-VIA material cadmium-zinc-telluride (CdZnTe). Other suitable substrate 10 semiconductor materials include, but are not limited to, cadmium-telluride-selenide (CdTeSe), cadmium-telluride (CdTe), and a composite substrate including a Group IVA material such as silicon (Si) or germanium (Ge) in combination with a Group III-V material, such as GaAs, and optionally in combination with Group IIB-VIA material such as CdSnTe. Upon a surface of the substrate 10 is grown, by LPE, a layer 12 of LWIR responsive HgCdTe material.

By example, the LPE process employs a molten solution of Hg to which Te, Cd, and a selected dopant are added. Alternately, a molten Te solution has Hg, Cd, and a suitable dopant added thereto. The solution is typically maintained within a temperature range of 300° C. to 550° C. during the growth of the HgCdTe material upon the selected substrate. The resulting LPE-grown layer 12 of LWIR material is comprised of $Hg_{1-x}Cd_xTe$, wherein x is selected for providing absorption of LWIR radiation. The LWIR material is made n-type for forming, when subsequently delineated into electrically isolated regions, a plurality of n-on-p heterojunctions with a next formed layer of p+, narrower bandgap, MWIR or SWIR material. By example, the n-type LWIR responsive layer 12 is comprised of $Hg_{0.8}Cd_{0.2}Te$ having a thickness of approximately 10 micrometers, the layer 12 being doped with a donor species such as indium with a concentration of dopant atoms of approximately $2 \times 10^{15}$ cm$^{-3}$.

(FIG. 1b–FIG. 2, Block B) Over the LWIR layer 12 is next formed, by LPE or some other suitable process, such as MBE or MOCVD, a MWIR or a SWIR responsive layer 14. Layer 14 is comprised of epitaxial $Hg_{1-x}Cd_xTe$, wherein x is selected for providing absorption of MWIR radiation and is made p+ in order to function as a portion of a photodiode with the n-type LWIR layer 12. By example, + MWIR responsive layer 14 is comprised of $Hg_{0.7}Cd_{0.3}Te$ having a thickness of approximately one micrometer. If provided as a SWIR responsive layer, the layer 14 is comprised of $Hg_{0.6}Cd_{0.4}Te$ having a thickness of approximately one micrometer. Layer 14 is doped with an acceptor species such as arsenic (As), antimony (Sb), or phosphorus (P) with a concentration of dopant atoms of approximately $10^{17}$ cm$^{-3}$ to approximately $10^{18}$ cm$^{-3}$. In that the thickness of the layer 14 is made relatively small, an insignificant absorption of radiation occurs therein. A primary function of the layer 14 is not to absorb radiation to generate photocarriers, but to serve as a common electrical contact for the back-to-back n-p and p-n heterojunctions, as will be described.

(FIG. 1c–FIG. 2, Block C) Over the MWIR (SWIR) layer 14 is next formed, by LPE, MBE, or MOCVD, a MWIR responsive layer 16. Layer 16 is comprised of epitaxial $Hg_{1-x}Cd_xTe$, wherein x is selected for providing absorption of MWIR radiation and is made n-type in order to function as a portion of a photodiode with the p+ MWIR (SWIR) layer 14. By example, n-type MWIR responsive layer 16 is comprised of $Hg_{0.7}Cd_{0.3}Te$ having a thickness within a range of approximately 5 micrometers to approximately 10 micrometers. Layer 16 is doped with an acceptor species such as indium with a concentration of dopant atoms of approximately $2 \times 10^{15}$ cm$^{-3}$. Optionally, the surface of the MWIR layer 16 may be polished flat or diamond turned (planarized) before proceeding with the fabrication process.

At this point in the process, and as is shown in FIG. 1d and in FIG. 2, Block D, mesa structures may be etched into the MWIR layer 16 and partially into the + layer 14. The effect of mesa etching is to delineate the n-type MWIR layer 16 into a plurality of n-type MWIR regions 16a. Each of the regions 16a forms an n-on-p heterojunction with the underlying + layer 14. A suitable mesa etch process employs a photolithographically applied mask in combination with a wet chemical etch using, by example, a bromine-/ethylene glycol solution. Ion milling or reactive ion etching may also be employed to form the mesa structures.

(FIG. 1e, Block E) A next step of the method deposits a layer 18 of wide bandgap passivation material such as CdTe or ZnS. Alternatively, an oxide such as $SiO_2$ may be used for passivation. An anti-reflection (A/R) coating 20 may be applied over the CdTe passivation layer 18.

(FIG. 1f–FIG. 2, Block F) A next step of the method bonds the structure to a second substrate 22. The substrate 22 is comprised of material selected to be transparent at the spectral bands of interest. A presently preferred material is Si. However, other suitable substrate materials include, but are not limited to, GaAs, Ge, CdZnTe, CdTe, CdTeSe, sapphire ($Al_2O_3$), and combinations of these materials. The substrate 22 may be A/R coated prior to bonding. A presently preferred method adhesively bonds the substrate 22 to the CdTe passivation layer 18 with a polyimide-based adhesive. It is also within the scope of the invention to employ a non-permanent adhesive material, such as a wax, such that the substrate 22 may be subsequently removed after hybridizing the array with readout electronics. This aspect of the invention is described in further detail below with regard to FIG. 4.

(FIG. 1g–FIG. 2, Block G) A next step of the method removes the substrate 10 by diamond turning. The resulting structure has the LPE grown LWIR responsive layer 12 overlying a narrower bandgap MWIR or SWIR layer 14, which is the desired result.

Processing continues to further delineate the structure into an array of two-color photodetectors and to add the necessary contact metalization, indium bump interconnects (FIG. 2, Block H), and to hybridize the array with readout electronics (FIG. 2, Block I). In that the readout electronics are typically Si-based, the preferred substrate 22 material is also Si so as to provide a hybridized assembly wherein the array and readout have similar coefficients of thermal expansion. During use, IR radiation is incident on the exposed surface of the substrate 22, the radiation passing into the multilayered structure and being absorbed within the layers 16 and 12.

Figure 4:
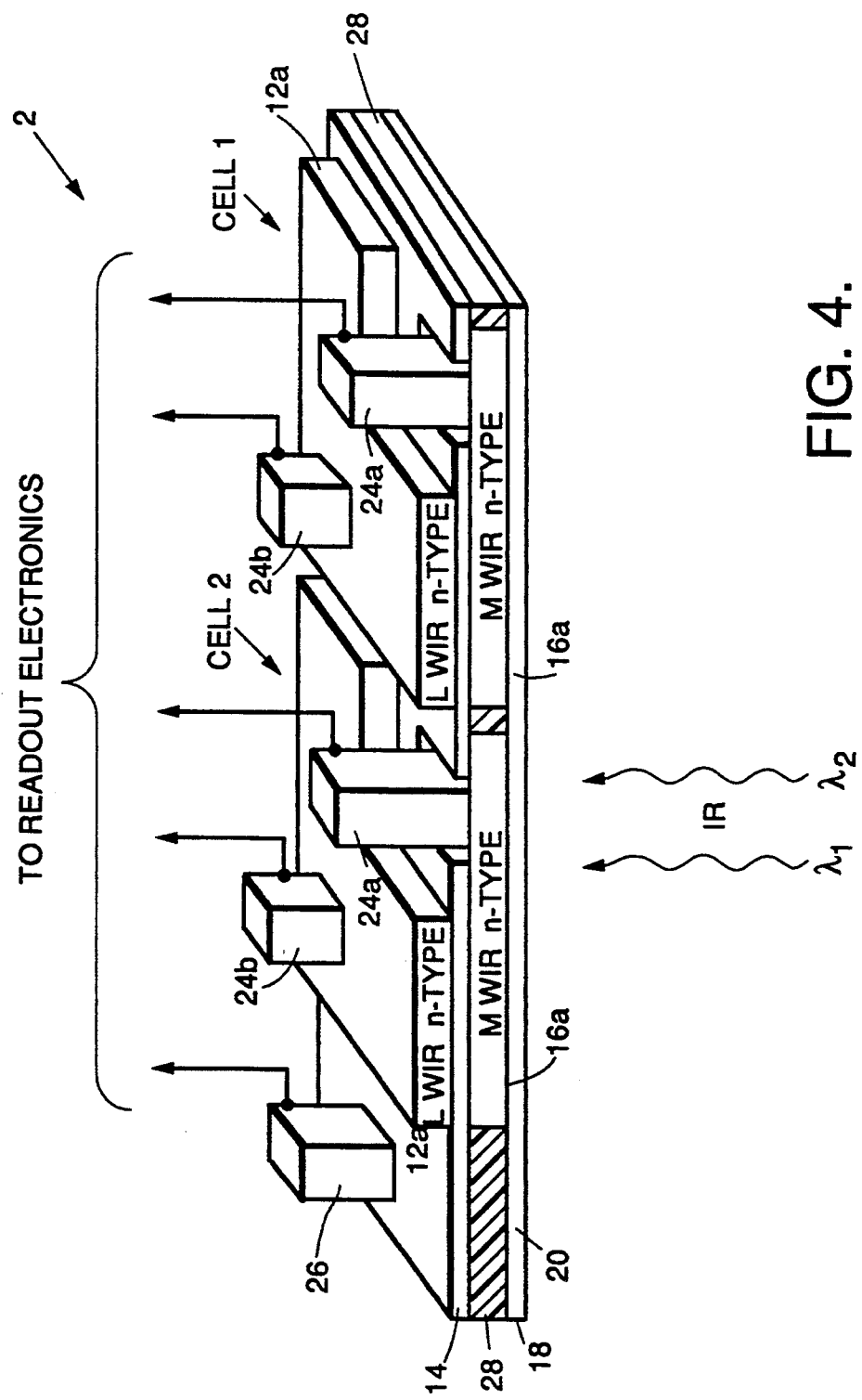
FIG. 4 is a cross-sectional view, not to scale, showing a two-color photodetector array that is constructed in accordance with a second embodiment of the method of the invention.

An alternate embodiment modifies the step shown at FIG. 1g so as to temporarily bond the substrate 22 to the passivation layer 18. Subsequently, and after hybridizing the radiation detector array with the readout electronics, the substrate 22 is removed (FIG. 2, Block J). As seen in FIG. 4, this results in a thinned detector array structure having reduced thermal mass and, as a result, a reduced cool-down time to a desired operating temperature.

As a further alternative embodiment to the step shown in FIG. 1c, the surface of the MWIR (SWIR) layer 14 has a photolithographically applied mask having openings for defining desired photodetector sites. The MWIR layer 16 is then applied by LPE, MBE, or MOCVD, with the MWIR material being applied only through openings in the mask. By example, one suitable masking material, that is also compatible with LPE, is comprised of SiO. The dielectric mask layer may be stripped after forming the MWIR material 16, or the material may be left in place to further electrically isolate the MWIR regions from one another.

Figure 3:
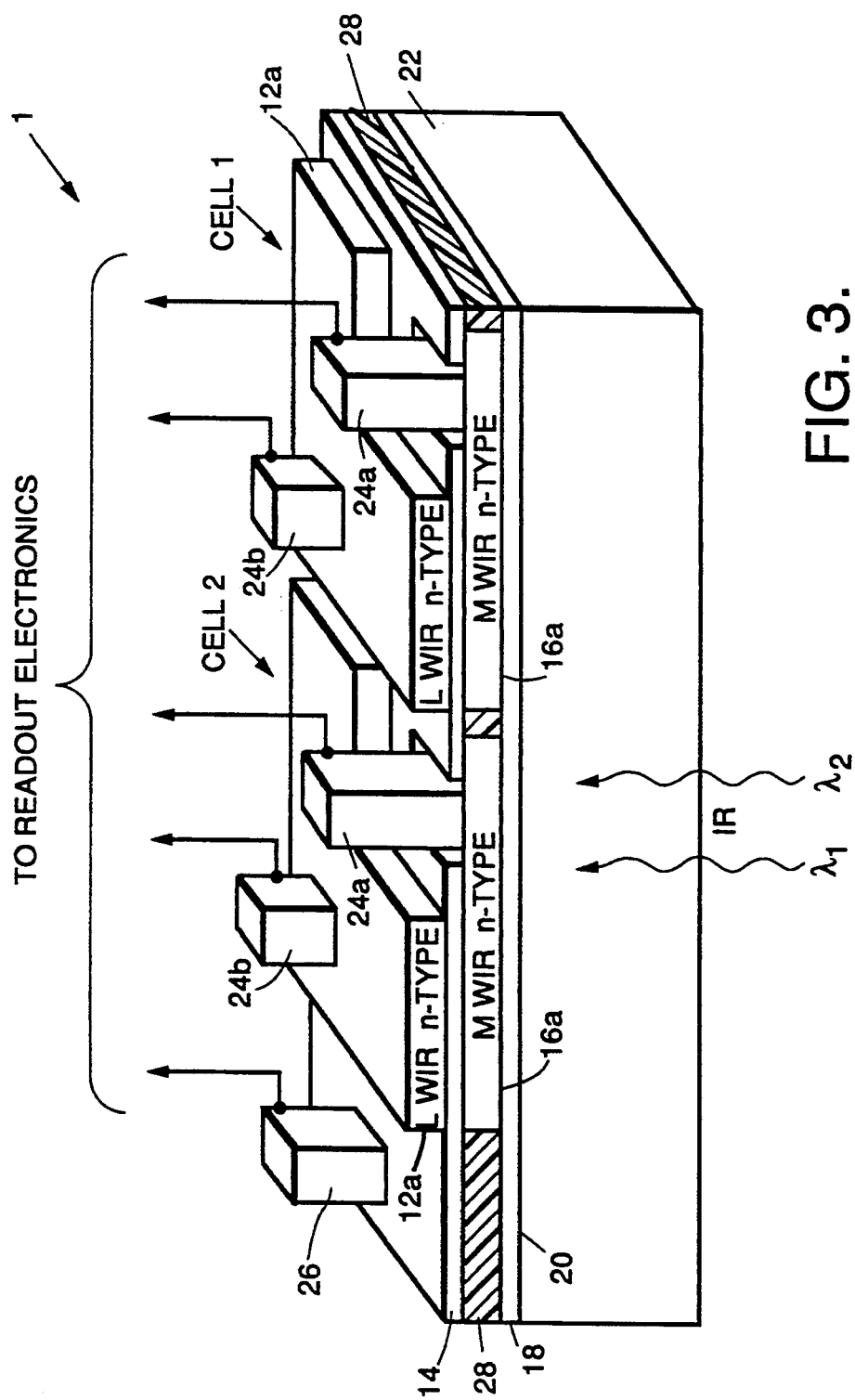
FIG. 3 is a cross-sectional view, not to scale, showing a two-color photodetector array that is constructed in accordance with one embodiment of the method of the invention.

FIG. 3 illustrates in cross-section an embodiment of an array 1 of two-color photodetectors. Array 1 is shown to have two photodetectors, referred to as CELL 1 and CELL 2. A typical array would have a significantly larger number of photodetectors arranged in a linear or a two-dimensional array. In the illustrated embodiment the MWIR layer 16 is differentiated into a plurality of regions 16a, and the aforementioned dielectric mask material, such as SiO, has been left in place to form the dielectric layer 28. The LWIR layer 12 is selectively removed by, for example a bromine etch, to form a plurality of LWIR regions 12a, individuals ones of which are in registration with an underlying one of the MWIR regions 16a. Apertures are formed through the MWIR (SWIR)

+ layer 14 to apply contact metal and interconnects 24a. Interconnects 24a are preferably indium bumps. Similar indium bump interconnects 24b are applied to each of the LWIR regions 12a, as is an indium bump interconnect 26 that forms an electrical contact to the + MWIR (SWIR) layer 14. Layer 14 forms a common contact to each of the n-p and p-n junctions within each CELL, and enables each CELL to simultaneously detect radiation within a first spectral band (designated lambda 1) and a second spectral band (designated lambda 2). The indium bump interconnects 24a, 24b, and 26 couple the array 1 to readout electronics (not shown) to form a hybrid assembly.

In accordance with an aspect of the invention, the n-type LWIR regions 12a are formed from the LPE-grown layer 12, and provide high quality heterojunctions with the + MWIR (SWIR) common contact layer 14.

FIG. 4 illustrates in cross-section an embodiment of an array 2 of two-color photodetectors. Array 2 is similar in most respects to the array 1 of FIG. 3. A significant difference is that the substrate 22 has been removed after hybridizing the array 2 to the readout electronics (not shown). This results in a thinned two-color detector array having significantly less thermal mass than the array 1 of FIG. 3. As a result, faster cool-down times are achieved.

It should be realized that although the invention has been described in the context of specific materials, specific dimensions, and specific processing parameters, such as etchants and deposition techniques, a number of modifications to these various materials, dimensions, and processing parameters may be made, while still obtaining the same result. Furthermore, the teaching of the invention is also applicable to p-n-p two-color detectors. Also, other combinations of spectral regions may be provided, such as VLWIR/MWIR/MWIR and VLWIR/LWIR/MWIR. Thus, while the invention has been particularly shown and described with respect to preferred embodiments thereof, it will be understood by those skilled in the art that changes in form and details may be made therein without departing from the scope and spirit of the invention.

What is claimed is:

1. A method for fabricating a radiation detector, comprising the steps of:

providing a first substrate:

growing on a surface of the first substrate, by a liquid phase epitaxy process, a first layer comprised of a Group IIB-VIA semiconductor material having a first electrical conductivity and a bandgap selected for absorbing infrared radiation within a first spectral band, wherein the first spectral band includes LWIR radiation or VLWIR radiation;

growing on a surface of the first layer a second layer comprised of a Group IIB-VIA semiconductor material having a second electrical conductivity and a narrower bandgap than the first layer;

growing, on a surface of the second layer, a third layer comprised of a Group IIB-VIA semiconductor material having the first electrical conductivity and a bandgap that is narrower than the bandgap of the first layer, the bandgap of the third layer being selected for absorbing infrared radiation within a second spectral band having a shorter wavelength than the first spectral band;

forming a passivation layer upon a surface of the third layer:

bonding a second substrate to a surface of the passivation layer; and removing the first substrate.

2. A method as set forth in claim 1 and further including a step of differentiating the first, second, and third layers into a plurality of back-to-back pn heterojunctions.

3. A method as set forth in claim 1 wherein the step of forming a passivation layer includes an initial step of forming a plurality of mesa structures by selectively removing portions of said third layer.

4. A method as set forth in claim 1 wherein the step of growing the third layer includes an initial step of applying a mask to the surface of the second layer, the mask having apertures made therein for defining regions wherein the third layer is to be grown.

5. A method as set forth in claim 1 wherein the first substrate is comprised of a material selected from the group consisting essentially of Group IIB-VIA semiconductor material, Group IIIA-VA semiconductor material, Group IVA semiconductor material, and combinations thereof.

6. A method as set forth in claim 1 wherein the first type of electrical conductivity is n-type, and wherein the second type of electrical conductivity is p-type.

7. A method as set forth in claim 1 wherein the second layer has a bandgap that is responsive to MWIR or SWIR radiation, and wherein the second spectral band is MWIR.

8. A method as set forth in claim 1 wherein the step of growing a second layer grows the second layer by a liquid phase epitaxy process, and wherein the step of growing a third layer grows the third layer by a growth process selected from the group consisting essentially of liquid phase epitaxy, molecular beam epitaxy, and metal organic chemical vapor deposition.

9. A method as set forth in claim 1 wherein the step of forming a passivation layer includes an initial step of planarizing the surface of the third layer.

10. A method as set forth in claim 1 wherein the step of forming a passivation layer includes a further step of depositing an anti-reflection coating on a surface of the passivation layer.

11. A method as set forth in claim 1 wherein the step of bonding a second substrate to a surface of the passivation layer includes a step of selecting a material for the second substrate from the group consisting essentially of Group IIB-VIA semiconductor material, Group IIIA-VA semiconductor material, Group IVA semiconductor material, sapphire, and combinations thereof.

* * * * *